United States Patent
Latchford et al.

(10) Patent No.: US 6,967,072 B2
(45) Date of Patent: Nov. 22, 2005

(54) PHOTOLITHOGRAPHY SCHEME USING A SILICON CONTAINING RESIST

(75) Inventors: Ian Latchford, Sunnyvale, CA (US); Christopher Dennis Bencher, San Jose, CA (US); Yuxiang Wang, San Jose, CA (US); Mario Dave Silvetti, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 255 days.

(21) Appl. No.: 09/921,938

(22) Filed: Aug. 2, 2001

(65) Prior Publication Data

US 2002/0001778 A1 Jan. 3, 2002

Related U.S. Application Data

(63) Continuation-in-part of application No. 09/590,322, filed on Jun. 8, 2000.

(51) Int. Cl.⁷ .......................... G03F 7/004; G03F 7/085
(52) U.S. Cl. ................... 430/311; 430/317; 430/323; 430/270.1; 438/690; 438/706; 438/710; 438/712
(58) Field of Search ................. 430/311, 317, 430/323, 270.1; 438/690, 706, 710, 712

(56) References Cited

U.S. PATENT DOCUMENTS

| 4,576,834 A | * | 3/1986 | Sobczak ...................... 427/93 |
| 5,022,959 A | | 6/1991 | Itoh et al. |
| 5,091,339 A | | 2/1992 | Carey ......................... 437/187 |
| 5,461,003 A | | 10/1995 | Havemann et al. |
| 5,674,573 A | | 10/1997 | Mitani et al. |
| 5,700,626 A | | 12/1997 | Lee et al. ................... 430/296 |
| 5,759,745 A | | 6/1998 | Hollingsworth ............. 430/313 |
| 5,759,913 A | | 6/1998 | Fulford, Jr. et al. |
| 5,789,320 A | | 8/1998 | Andricacos et al. |
| 5,830,332 A | * | 11/1998 | Babich et al. .......... 204/192.15 |
| 5,866,920 A | | 2/1999 | Matsumoto et al. |
| 5,900,288 A | | 5/1999 | Kuhman et al. |
| 5,981,398 A | | 11/1999 | Tsai et al. .................... 438/710 |
| 5,986,344 A | | 11/1999 | Subramanion et al. |
| 5,998,100 A | | 12/1999 | Azuma et al. |
| 6,008,140 A | | 12/1999 | Ye et al. |
| 6,025,273 A | | 2/2000 | Chen et al. ................. 438/706 |
| 6,030,901 A | | 2/2000 | Hopper et al. |

(Continued)

FOREIGN PATENT DOCUMENTS

| EP | 0 381 109 A2 | 8/1990 |
| EP | 0 901 156 A2 | 3/1999 |
| JP | 11-026578 | 1/1997 |
| JP | 09-045633 | 2/1997 |
| WO | WO 00/05763 A1 | 2/2000 |

OTHER PUBLICATIONS

U.S. Appl. No. 10/768,724, filed on Jan. 30, 2004.
U.S. Appl. No. 10/800,112, filed on Mar. 12, 2004.
U.S. Appl. No. 10/799,147, filed on Mar. 12, 2004.
European Search Report for 01102401.5–1235, dated Jun. 9, 2004.

*Primary Examiner*—Amanda Walke
(74) *Attorney, Agent, or Firm*—Moser, Patterson & Sheridan

(57) ABSTRACT

A method for forming a patterned amorphous carbon layer in a semiconductor stack, including forming an amorphous carbon layer on a substrate and forming a silicon containing photoresist layer on top of the amorphous carbon layer. Thereafter, the method includes developing a pattern transferred into the resist layer with a photolithographic process and etching through the amorphous carbon layer in at least one region defined by the pattern in the resist layer, wherein a resist layer hard mask is formed in an outer portion of the photoresist layer during etching.

49 Claims, 12 Drawing Sheets

U.S. PATENT DOCUMENTS

| | | | |
|---|---|---|---|
| 6,035,803 A | | 3/2000 | Robles et al. |
| 6,042,993 A | * | 3/2000 | Leuschner et al. .......... 430/296 |
| 6,057,226 A | | 5/2000 | Wong |
| 6,064,118 A | | 5/2000 | Sasaki |
| 6,066,577 A | | 5/2000 | Cooney, III et al. |
| 6,080,529 A | | 6/2000 | Ye et al. |
| 6,087,064 A | * | 7/2000 | Lin et al. ................. 430/270.1 |
| 6,087,269 A | | 7/2000 | Williams .................... 438/735 |
| 6,091,081 A | | 7/2000 | Matsubara et al. ........... 257/52 |
| 6,098,568 A | | 8/2000 | Raoux et al. |
| 6,140,224 A | | 10/2000 | Lin |
| 6,140,226 A | | 10/2000 | Grill et al. ................. 438/637 |
| 6,143,476 A | | 11/2000 | Ye et al. |
| 6,153,935 A | | 11/2000 | Edelstein et al. |
| 6,156,480 A | * | 12/2000 | Lyons .................... 430/270.1 |
| 6,156,485 A | | 12/2000 | Tang et al. ................. 430/313 |
| 6,165,695 A | * | 12/2000 | Yang et al. ................. 430/314 |
| 6,165,890 A | | 12/2000 | Kohl et al. |
| 6,184,128 B1 | | 2/2001 | Wang et al. ................. 438/637 |
| 6,187,505 B1 | * | 2/2001 | Lin et al. ................. 430/270.1 |
| 6,191,463 B1 | * | 2/2001 | Mitani et al. ............... 257/411 |
| 6,204,168 B1 | | 3/2001 | Naik et al. |
| 6,207,573 B1 | | 3/2001 | Lee ........................... 438/700 |
| 6,211,065 B1 | | 4/2001 | Xi et al. |
| 6,214,730 B1 | | 4/2001 | Cooney, III et al. |
| 6,235,629 B1 | | 5/2001 | Takenaka |
| 6,259,127 B1 | * | 7/2001 | Pan ........................... 257/301 |
| 6,291,334 B1 | | 9/2001 | Somekh |
| 6,316,347 B1 | | 11/2001 | Chang et al. |
| 6,323,119 B1 | | 11/2001 | Xi et al. |
| 6,331,380 B1 | | 12/2001 | Ye et al. |
| 6,333,255 B1 | | 12/2001 | Sekiguchi |
| 6,358,573 B1 | | 3/2002 | Raoux et al. |
| 6,380,106 B1 | | 4/2002 | Lim et al. |
| 6,413,852 B1 | | 7/2002 | Grill et al. |
| 6,423,384 B1 | | 7/2002 | Khazeni et al. |
| 6,458,516 B1 | | 10/2002 | Ye et al. |
| 6,514,857 B1 | | 2/2003 | Naik et al. |
| 6,541,397 B1 | | 4/2003 | Bencher |
| 6,573,030 B1 | | 6/2003 | Fairbairn et al. |
| 6,624,064 B1 | | 9/2003 | Sahin et al. |
| 6,635,583 B2 | | 10/2003 | Bencher et al. |
| 2001/0007788 A1 | | 7/2001 | Chang et al. |
| 2002/0001778 A1 | | 1/2002 | Latchford et al. |
| 2002/0086547 A1 | | 7/2002 | Mui et al. |
| 2002/0090794 A1 | | 7/2002 | Chang et al. |
| 2003/0091938 A1 | | 5/2003 | Fairbaim et al. |
| 2003/0186477 A1 | | 10/2003 | Bencher |

* cited by examiner

PHOTOLITHOGRAPHY SCHEME USING A SILICON CONTAINING RESIST

CROSS-REFERENCE TO RELATED APPLICATIONS

This application is a continuation-in-part of co-pending U.S. patent application Ser. No. 09/590,322, filed Jun. 8, 2000, which is hereby incorporated by reference.

BACKGROUND OF THE INVENTION

1. Field of the Invention

The present invention generally relates to an apparatus and method for using a silicon containing photoresist material in integrated circuit fabrication, and more particularly, to the use of a silicon containing photoresist material for use in etching amorphous carbon films in integrated circuit fabrication processes.

2. Description of the Related Art

In recent years integrated circuits have evolved into complex devices that commonly include millions of transistors, capacitors, resistors, and other electronic components on a single chip. Therefore, there is an inherent demand for increased circuit densities, as well as a continual demand for faster and more efficient circuit components. The combined demands for faster circuits having greater circuit densities imposes corresponding demands on the materials used to fabricate such integrated circuits. In particular, as the dimensions of integrated circuit components are reduced to sub-micron-sized dimensions, it has been necessary to investigate the use of low resistivity conductive materials, such as copper and/or low dielectric constant insulating materials having a dielectric constant less than about 4.5, in order to improve the electrical performance of these faster and more dense circuit components.

The demands for faster components having greater circuit densities also imposes demands on process sequences used for integrated circuit manufacture. For example, in process sequences using conventional lithographic techniques, a layer of energy sensitive resist is generally formed over a stack of material layers on a substrate. An image of a pattern may then be introduced into the energy sensitive resist layer. Thereafter, the pattern introduced into the energy sensitive resist layer may be transferred into one or more layers of the material stack formed on the substrate using the layer of energy sensitive resist as a mask. The pattern introduced into the energy sensitive resist may then be transferred into a material layer(s) using a chemical and/or physical etchant. A chemical etchant is generally designed to have a greater etch selectivity for the material layer(s) than for the energy sensitive resist, which generally indicates that the chemical etchant will etch the material layer(s) at a faster rate than it etches the energy sensitive resist. The faster etch rate for the one or more material layers of the stack typically prevents the energy sensitive resist material from being consumed prior to completion of the pattern transfer.

However, demands for greater circuit densities on integrated circuits have necessitated smaller pattern dimensions i.e., sub-micron dimensions. As these pattern dimensions are reduced to accommodate sub-micron type devices, the thickness of the energy sensitive resist is generally reduced correspondingly in order to proportionally control pattern resolution. These substantially thinner resist layers, such as, layers having a thickness of less than about 6000 Å, for example, may, however, be insufficient to mask underlying material layers during a pattern transfer step using chemical etchants.

Therefore, if the thinner resist layer is insufficient to mask the underlying material layers, then an additional intermediate oxide layer i.e., silicon dioxide, silicon nitride, or other similar oxide material, which is often termed a hardmask, may be used between the energy sensitive resist layer and the underlying material layers in order to facilitate pattern transfer into the underlying material layers. However, some material structures, such as damascene, for example, include silicon dioxide and/or silicon nitride layers therein, and therefore, these structures generally cannot be patterned using a silicon dioxide or silicon nitride hardmask, as the same material is used in the structure itself. Nevertheless, although the implementation of the intermediate layer is generally effective in masking the underlying layers, the process of forming the intermediate layer and removing the intermediate layer adds additional overhead and process time to the throughput rate of devices implementing this layer.

Resist patterning problems are further compounded when lithographic imaging tools having deep ultraviolet (DUV) imaging wavelengths, i.e., wavelengths less than about 250 nanometers, are used to generate the resist patterns. The DUV imaging wavelengths are generally known to improve resist pattern resolution as a result of the diffraction effects being reduced at the shorter wavelengths. However, the increased reflective nature of many underlying materials, i.e., polysilicon and metal silicides, for example, may operate to degrade the resulting resist patterns at DUV wavelengths.

One technique proposed to minimize reflections from an underlying material layer uses an anti-reflective coating (ARC). The ARC is formed over the reflective material layer prior to resist patterning. The ARC generally suppresses the reflections off the underlying material layer during resist imaging, thereby providing more accurate pattern replication in the layer of energy sensitive resist.

A number of ARC materials have been suggested for use in combination with energy sensitive resists. For example, U.S. Pat. No. 5,626,967 issued May 6, 1997 to Pramanick describes the use of titanium nitride anti-reflective coatings. However, titanium nitride is exhibits increasingly metallic characteristics as the exposure wavelength is reduced below 248 nm, as titanium nitride is known to exhibit high reflectivity for DUV radiation, and therefore, is generally known not to be an effective anti-reflective coating for DUV wavelengths.

U.S. Pat. No. 5,710,067 issued Jan. 20, 1998 to Foote discloses the use of silicon oxynitride antireflective films. Silicon oxynitride films are difficult to remove and typically leave residues behind that potentially interfere with subsequent integrated circuit fabrication steps.

In view of conventional photolithographic techniques, there exists a need in the art for a photoresist layer useful for integrated circuit fabrication, wherein the photoresist layer may be used without an intermediate layer, and further, without an ARC layer. There exists a further need for a photoresist capable of forming a silicon oxide hard mask on the surface of the photoresist, wherein the silicon oxide hard mask is configured to provide additional selectivity between the photoresist and an underlying material layer, which may be amorphous carbon, for example.

SUMMARY OF THE INVENTION

Embodiments of the invention provide a method for forming a patterned amorphous carbon layer in a semiconductor stack, including forming an amorphous carbon layer on a substrate and forming a silicon containing photoresist layer on top of the amorphous carbon layer. Thereafter, the method includes developing a pattern transferred into the resist layer with a photolithographic process and etching through the amorphous carbon layer in at least one region defined by the pattern in the resist layer, wherein the etching includes forming a resist layer hard mask in an outer portion of the photoresist layer.

Embodiments of the invention further provide a method for patterning a material layer in a multilayer stack, including forming an amorphous carbon layer on an underlying material layer in the multilayer stack and forming a photoresist layer on top of the amorphous carbon layer. Thereafter, the method includes developing a resist pattern transferred into the photoresist layer, etching through the amorphous carbon layer in a patterned region defined by the resist pattern, and forming an in situ resist layer hard mask in an outer portion of the photoresist layer. The method further includes etching through the material layer using the patterned region etched into the amorphous carbon layer and the resist pattern.

Embodiments of the invention further provide a method for forming a hardmask in a resist layer, including depositing a silicon containing photo resist layer over a material layer, developing a pattern in the silicon containing photo resist layer, and etching the material layer with an oxygen based etchant to transfer the pattern into the material layer. The method further includes forming a hardmask layer in the silicon containing photo resist layer during the etching process.

BRIEF DESCRIPTION OF THE DRAWINGS

So that the manner in which the above recited features, advantages, and objects of the invention are obtained may be understood in detail, a more particular description of the invention briefly summarized above may be had by reference to the embodiments thereof, which are illustrated in the appended drawings.

It is to be noted, however, that the appended drawings illustrate only typical embodiments of this invention, and are therefore, not to be considered limiting of its scope, for the invention may admit to other equally effective embodiments.

DETAILED DESCRIPTION OF THE PREFERRED EMBODIMENT

Embodiments of the invention generally provide an apparatus and method for forming an integrated circuit having an amorphous carbon layer formed therein. The amorphous carbon layer may be formed by thermally decomposing a gas mixture including a hydrocarbon compound and an inert gas. The gas mixture, which may include one or more additive gases, may be introduced into a process chamber where plasma enhanced thermal decomposition of the hydrocarbon compound in close proximity to the surface of a substrate results in deposition of an amorphous carbon layer on the substrate surface. The amorphous carbon layer may be compatible with integrated circuit fabrication processes, which are generally discussed below.

Figure 1:
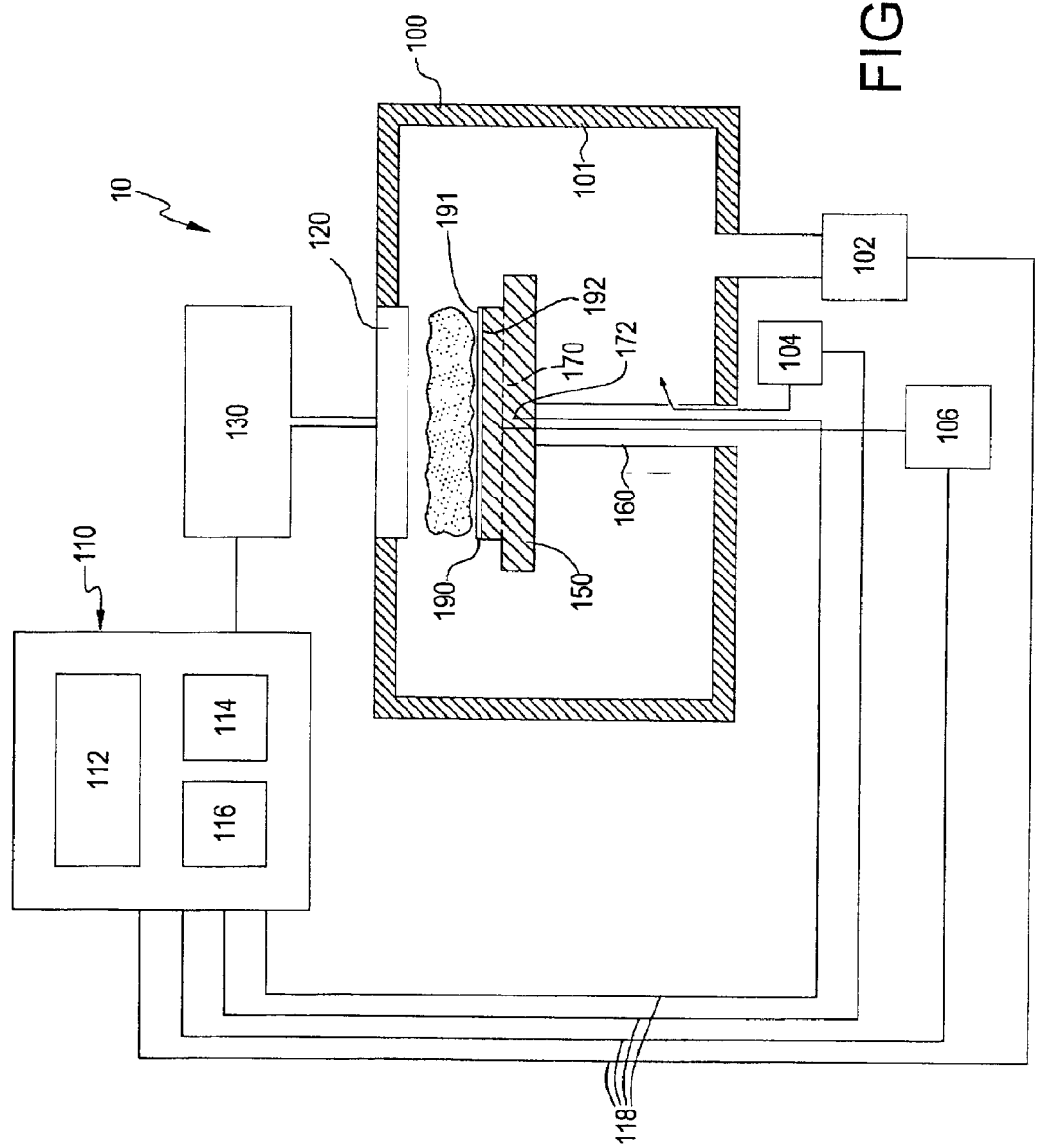
FIG. 1 illustrates a schematic of an apparatus that may be used to practice embodiments of the invention.

FIG. 1 illustrates schematic representation of a wafer processing system 10 that may be used to perform amorphous carbon layer deposition. This apparatus generally includes a process chamber 100, a gas panel 130, a control unit 110, and other hardware components, such as power supplies, vacuum pumps, etc. that are known in the art to be used to manufacture integrated circuit components. Examples of system 10 may include CENTURA® systems, PRECISION 5000®, systems and PRODUCER™ systems, all of which are commercially available from Applied Materials Inc., of Santa Clara, Calif.

The process chamber 100 generally includes a support pedestal 150, which is used to support a substrate, such as a semiconductor wafer 190. This pedestal 150 may typically be moved in a vertical direction inside the chamber 100 using a displacement mechanism (not shown). Depending on the specific process, wafer 190 may be heated to a desired temperature by an embedded heating element 170 within pedestal 150. For example, the pedestal 150 may be resistively heated by applying an electric current from an AC supply 106 to heater element 170, which then heats wafer 190. A temperature sensor 172, such as a thermocouple, for example, may be embedded in wafer support pedestal 150 in order to monitor the temperature of the pedestal 150 through cooperative interaction with a process control system (not shown). The temperature read by the thermocouple may be used in a feedback loop to control the power supply 16 for the heating element 170 such that the wafer temperature can be maintained or controlled at a desired temperature that is suitable for the particular process application. Alternatively, pedestal 150 may utilize alternative heating and/or cooling configurations known in the art, such as, plasma and/or radiant heating configurations or cooling channels (not shown).

A vacuum pump 102, may be used to evacuate process chamber 100 and to maintain the desired gas flows and dynamic pressures inside chamber 100. A showerhead 120, through which process gases may be introduced into the chamber 100, may be located above wafer support pedestal 150. Showerhead 120 may generally be connected to a gas panel 130, which controls and supplies various gases used in different steps of the process sequence.

Showerhead 120 and wafer support pedestal 150 may also form a pair of spaced electrodes. Therefore, when an electric field is generated between these electrodes, the process gases introduced into the chamber 100 by showerhead 120 may be ignited into a plasma, assuming that the potential between the spaced electrodes is sufficient to initiate and maintain the plasma. Typically, the driving electric field for the plasma is generated by connecting the wafer support pedestal 150 to a source of radio frequency (RF) power (not shown) through a matching network (not shown). Alternatively, the RF power source and matching network may be coupled to the showerhead 120, or coupled to both the showerhead 120 and the wafer support pedestal 150.

Plasma enhanced chemical vapor deposition (PECVD) techniques generally promote excitation and/or disassociation of the reactant gases by the application of the electric field to a reaction zone near the substrate surface, creating a plasma of reactive species immediately above the substrate surface. The reactivity of the species in the plasma reduces the energy required for a chemical reaction to take place, in effect lowering the required temperature for such PECVD processes.

In embodiments of the invention, amorphous carbon layer deposition is accomplished through plasma enhanced thermal decomposition of a hydrocarbon compound, such as propylene ($C_3H_6$) for example. Propylene may be introduced into process chamber 100 under the control of gas panel 130. The hydrocarbon compound may be introduced into the process chamber as a gas with a regulated flow through showerhead 120, for example.

Proper control and regulation of the gas flows through the gas panel 130 may be conducted by one or more mass flow controllers (not shown) and a controller unit 110 such as a computer. The showerhead 120 allows process gases from the gas panel 30 to be uniformly distributed and introduced into the process chamber 100 proximate the surface of the wafer. Illustratively, the control unit 110 may include a central processing unit (CPU) 112, support circuitry 114, and various memory units containing associated control software 116 and/or process related data. Control unit 110 may be responsible for automated control over various steps required for wafer processing, such as wafer transport, gas flow control, temperature control, chamber evacuation, and other processes known in the art to be controlled by an electronic controller. Bi-directional communications between the control unit 110 and the various components of the apparatus 10 may be handled through numerous signal cables collectively referred to as signal buses 118, some of which are illustrated in FIG. 1.

The heated pedestal 150 used in the present invention may be manufactured from aluminum, and may include a heating element 170 embedded at a distance below the wafer support surface 151 of the pedestal 150. The heating element 170 may be manufactured from a nickel-chromium wire encapsulated in an incoloy sheath tube. By properly adjusting the current supplied to the heating element 170, the wafer 190 and the pedestal 150 may be maintained at a relatively constant temperature during wafer preparation and film deposition processes. This may be accomplished through a feedback control loop, in which the temperature of the pedestal 150 is continuously monitored by a thermocouple 172 embedded in the pedestal 150. This information may be transmitted to the control unit 110 via a signal bus 118, which may respond by sending the necessary signals to the heater power supply. Adjustment may subsequently be made in the power supply 106 so as to maintain and control the pedestal 150 at a desirable temperature, i.e., a temperature that is appropriate for the specific process application. Therefore, when the process gas mixture exits showerhead 120 above the wafer, plasma enhanced thermal decomposition of the hydrocarbon compound occurs at the surface 191 of the heated wafer 190, resulting in a deposition of an amorphous carbon layer on the wafer 190.

Amorphous Carbon Layer Formation

In one embodiment of the invention, the amorphous carbon layer may be formed from a gas mixture of a hydrocarbon compound and an inert gas such as argon (Ar) or helium (He). The hydrocarbon compound may have a general formula $C_xH_y$, where x has a range of between 2 and 4 and y has a range of between 2 and 10. For example, propylene ($C_3H_6$), propyne ($C_3H_4$), propane ($C_3H_8$), butane ($C_4H_{10}$), butylene ($C_4H_8$), butadiene ($C_4H_6$), or acetelyne ($C_2H_2$) as well as combinations thereof, may be used as the hydrocarbon compound. Similarly, a variety of gases such as hydrogen ($H_2$), nitrogen ($N_2$), ammonia ($NH_3$), or combinations thereof, among others, may be added to the gas mixture, if desired. Ar, He, and $N_2$ may be used to control the density and deposition rate of the amorphous carbon layer. The addition of $H_2$ and/or $NH_3$ can be used to control the hydrogen ratio of the amorphous carbon layer, as discussed below.

In general, the following deposition process parameters may be used to form the amorphous carbon layer. The process parameters range from a wafer temperature of about 100° C. to about 500° C., a chamber pressure of about 1 torr to about 20 torr, a hydrocarbon gas (CxHy) flow rate of about 50 sccm to about 500 sccm (per 8 inch wafer—for example), a RF power of between about 3 W/in$^2$ to about 20 W/in$^2$, and a plate spacing of between about 300 mils to about 600 mils. The above process parameters provide a typical deposition rate for the amorphous carbon layer in the range of about 100 A/min to about 1000 A/min and may be implemented on a 200 mm substrate in a deposition chamber available from Applied Materials, Inc. of Santa Clara, Calif.

Other deposition chambers are within the scope of the invention and the parameters listed above may vary according to the particular deposition chamber used to form the amorphous carbon layer. For example, other deposition chambers may have a larger or smaller volume, requiring gas flow rates that are larger or smaller than those recited for deposition chambers available from Applied Materials, Inc.

The as-deposited amorphous carbon layer generally has an adjustable carbon:hydrogen ratio that ranges from about 10% hydrogen to about 60% hydrogen. Controlling the hydrogen ratio of the amorphous carbon layer is desirable for tuning its optical properties as well as its etch selectivity. Specifically, as the hydrogen ratio decreases the optical properties of the as-deposited layer such as for example, the index of refraction (n) and the absorption coefficient (k) increase. Similarly, as the hydrogen ratio decreases the etch resistance of the amorphous carbon layer increases.

The light absorption coefficient, k, of the amorphous carbon layer may be varied between about 0.1 to about 1.0 at wavelengths below about 250 nm, making it suitable for use as an anti-reflective coating (ARC) at DUV wavelengths. The absorption coefficient of the amorphous carbon layer may be varied as a function of the deposition temperature. In particular, as the temperature increases, the absorption coefficient of the as-deposited layer likewise increases. For example, when propylene is the hydrocarbon compound the k value for the as-deposited amorphous carbon layers can be increased from about 0.2 to about 0.7 by increasing the deposition temperature from about 150° C. to about 480° C.

The absorption coefficient of the amorphous carbon layer may also be varied as a function of the additive used in the gas mixture. In particular, the presence of $H_2$, $NH_3$, $N_2$ or combinations thereof, in the gas mixture can increase the k value by about 10% to about 100%.

Integrated Circuit Fabrication Processes

A. Amorphous Carbon Hardmask

Figure 2A:
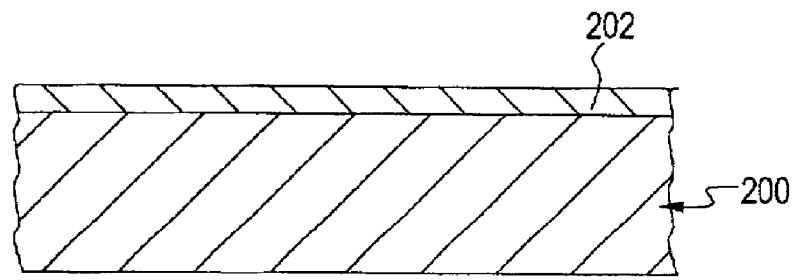
FIGS. 2a–2e illustrate schematic cross-sectional views of a substrate structure at different stages of integrated circuit fabrication incorporating an amorphous carbon layer as a hardmask.

FIGS. 2a–e illustrate schematic cross-sectional views of a substrate 200 at different stages of an integrated circuit fabrication sequence incorporating an amorphous carbon layer as a hardmask. In general, the substrate 200 refers to any workpiece on which processing is performed, and a substrate structure 250 is used to generally denote the substrate 200 together with other material layers formed on the substrate 200. Depending on the specific stage of processing, the substrate 200 may correspond to a silicon substrate, or other material layer that has been formed on the substrate. FIG. 2a, for example, illustrates a cross-sectional view of a substrate structure 250, having a material layer 202 that has been conventionally formed thereon. The material layer 202 may be an oxide (e.g., $SiO_2$). In general, the substrate 200 may include a layer of silicon, silicides, metals, or other materials. FIG. 2a illustrates one embodiment in which the substrate 200 is silicon having a silicon dioxide layer formed thereon.

Figure 2B:
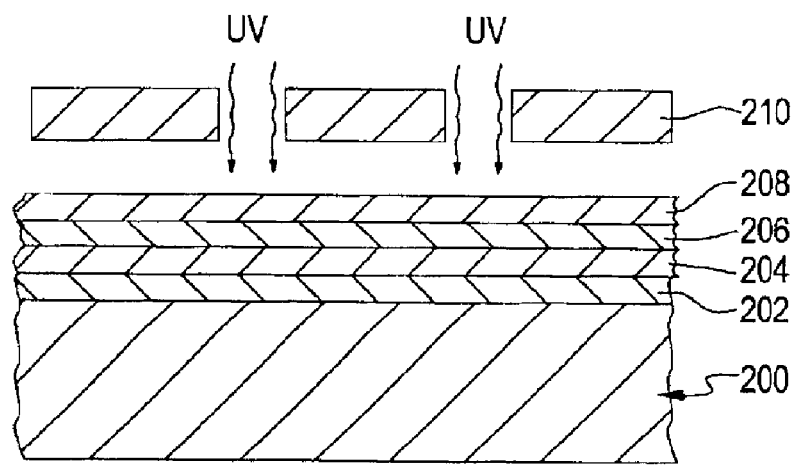

FIG. 2b illustrates an amorphous carbon layer 204 deposited on the substrate structure 250 of FIG. 2a. The amorphous carbon layer 204 is formed on the substrate structure 250 according to the process parameters described above. The thickness of the amorphous carbon layer is variable, depending on the specific stage of processing. Typically, the amorphous carbon layer may have a thickness in the range of about 50 Å to about 1000 Å.

Dependant on the etch chemistry of the energy sensitive resist material used in the fabrication sequence, an intermediate layer 206 may be formed on the amorphous carbon layer 204. The intermediate layer 206 may function as a mask for the amorphous carbon layer 204 when the pattern is transferred therein. The intermediate layer 206 may be conventionally formed on the amorphous carbon layer 204. The intermediate layer 206 may be an oxide, nitride, silicon oxynitride, silicon carbide, amorphous silicon, or other materials known in the art to provide hard mask characteristics.

A layer of energy sensitive resist material 208 may be formed on the intermediate layer 206. The layer of energy sensitive resist material 208 may be spin coated on the substrate to a thickness within the range of about 2000 Å to about 6000 Å. Most energy sensitive resist materials are sensitive to ultraviolet (UV) radiation having a wavelength less than about 450 nm. DUV resist materials are generally sensitive to UV radiation having wavelengths of 245 nm or 193 nm.

Figure 2C:
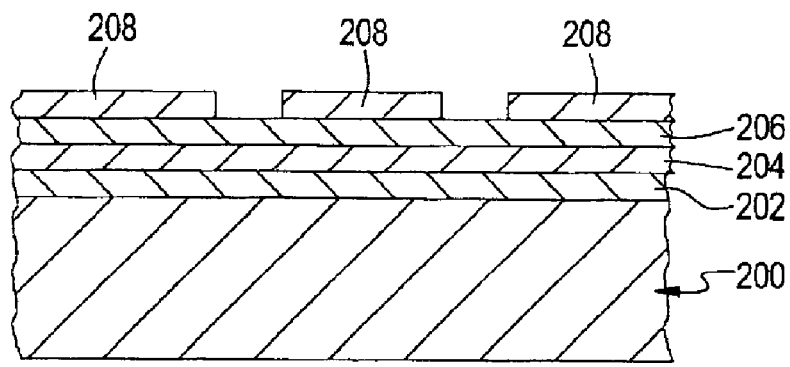
Figure 2D:
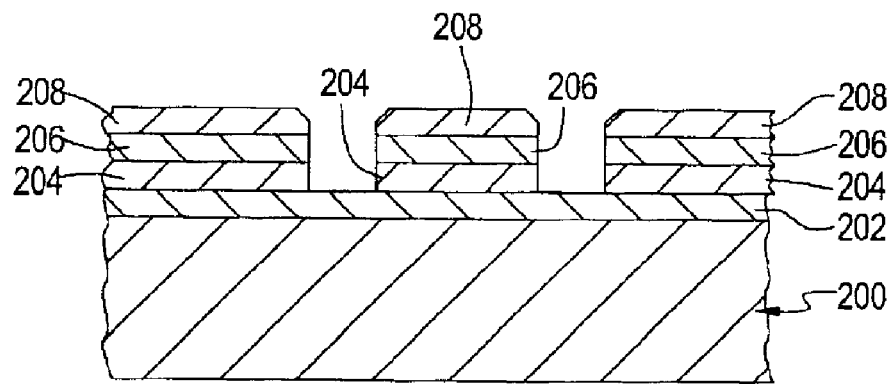

An image of a pattern may be introduced into the layer of energy sensitive resist material 208 by exposing such energy sensitive resist material 208 to UV radiation via mask 210. The image of the pattern introduced in the layer of energy sensitive resist material 208, may be developed in an appropriate developer to define the pattern through such layer, as shown in FIG. 2c. Thereafter, referring to FIG. 2d, the pattern defined in the energy sensitive resist material 208 is transferred through both the intermediate layer 206 and the amorphous carbon layer 204. The pattern is transferred through the intermediate layer 206 using the energy sensitive resist material 208 as a mask. The pattern is transferred through the intermediate layer 206 by etching the intermediate layer 206 using an appropriate chemical etchant. The pattern is then transferred through the amorphous carbon layer 204 using the intermediate layer 206 as a mask. The pattern is transferred through the amorphous carbon layer 204 by etching the amorphous carbon layer 204 using an appropriate chemical etchant (e. g., ozone, oxygen or ammonia plasmas).

Figure 2E:
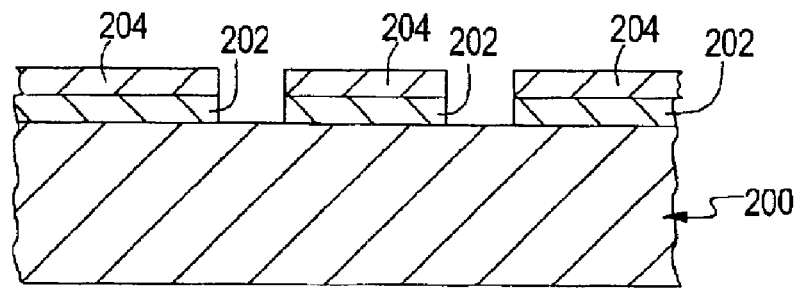

FIG. 2e illustrates the completion of the integrated circuit fabrication sequence by the transfer of the pattern defined in the amorphous carbon layer 204 through the silicon dioxide layer 202 using the amorphous carbon layer 204 as a hardmask. After the silicon dioxide layer 202 is patterned, the amorphous carbon layer 204 may be stripped from the substrate 200 by etching it in an ozone, oxygen or ammonia plasma.

In a specific example of a fabrication sequence, the pattern defined in the amorphous carbon hardmask may be incorporated into the structure of the integrated circuit, such as a damascene structure. Damascene structures are typically used to form metal interconnects on integrated circuits.

Figure 3A:
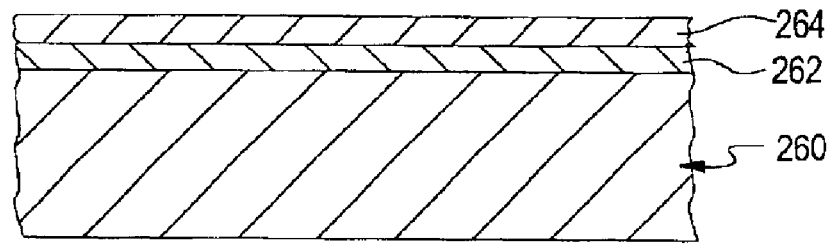
FIGS. 3a–3e illustrate schematic cross-sectional views of a damascene structure at different stages of integrated circuit fabrication incorporating an amorphous carbon layer as a hardmask.

FIGS. 3a–3e illustrate schematic cross-sectional views of a substrate 260 at different stages of a damascene structure fabrication sequence incorporating an amorphous carbon layer therein. Depending on the specific stage of processing, substrate 260 may correspond to a silicon substrate, or other material layer that has been formed on the substrate. FIG. 3a, for example, illustrates a cross-sectional view of a substrate 260 having a dielectric layer 262 formed thereon. The dielectric layer 262 may be an oxide (e. g., silicon dioxide, fluorosilicate glass). In general, the substrate 260 may include a layer of silicon, silicides, metals, or other materials known in the art as dielectric layers.

Figure 3B:
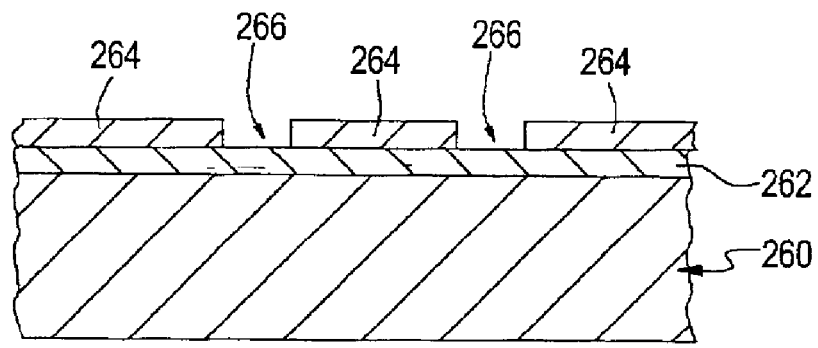

FIG. 3a illustrates an embodiment of the invention in which the substrate 260 is silicon having a fluorosilicate glass layer formed thereon. The dielectric layer 262 has a thickness of about 5,000 Å to about 10,000 Å, depending on the size of the structure to be fabricated. An amorphous carbon layer 264 is formed on the dielectric layer 262. The amorphous carbon layer is formed on the dielectric layer 262 according to the process parameters described above. The amorphous carbon layer 264 has a thickness of about 200 Å to about 1000 Å. Referring to FIG. 3b, the amorphous carbon layer 264 may be patterned and etched to define contact/via openings 266 and to expose the dielectric layer 262, in areas where the contacts/vias are to be formed. The amorphous carbon layer 264 may be patterned using conventional lithography techniques and etched using oxygen and/or ammonia plasmas.

Figure 3C:
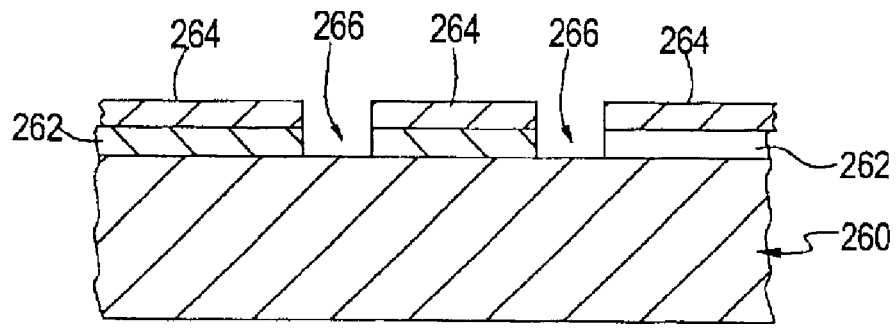
Figure 3D:
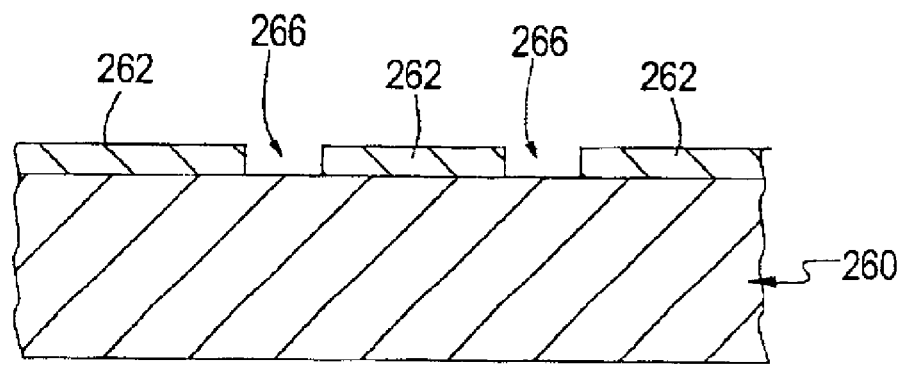

The contact/via openings 266 formed in the amorphous carbon layer 264 may be transferred into the dielectric layer 262 using the amorphous carbon layer 264 as a hard mask as shown in FIG. 3c. The contacts/vias 266 are etched using reactive ion etching or other anisotropic etching techniques. After the contacts/vias 266 are transferred into the dielectric layer 262, the amorphous carbon layer may be stripped from dielectric layer 262 by etching it in an ozone oxygen or ammonia plasma, as illustrated in FIG. 3d.

Figure 3E:
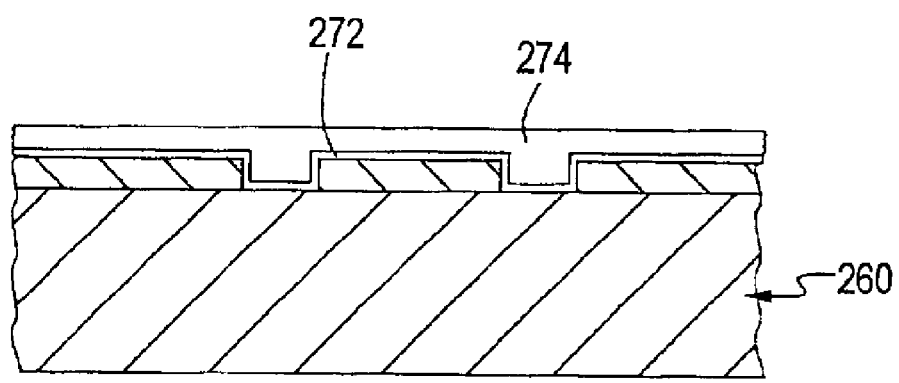

Referring to FIG. 3e, a metallization structure may be formed in the contacts/vias 266 using a conductive material 274 such as aluminum, copper, tungsten, or combinations thereof. Typically, copper is used to form the metallization structure due to its low resistivity (about 1.7 $\mu\Omega$-cm). The conductive material 274 may be deposited using chemical vapor deposition, physical vapor deposition, electroplating, or combinations thereof, to form the damascene structure. Preferably, a barrier layer 272 such as tantalum, tantalum nitride, or other suitable barrier is first deposited conformally in the metallization structure in order to prevent metal migration into the surrounding dielectric material layer 262. Additionally, the dielectric layer 262 preferably has a low dielectric constant (dielectric constants less than about 4.5) so as to prevent capacitive coupling between adjacent contacts/vias 266 of the metallization structure.

B. Amorphous Carbon Anti-Reflective Coating (ARC)

Figure 4A:
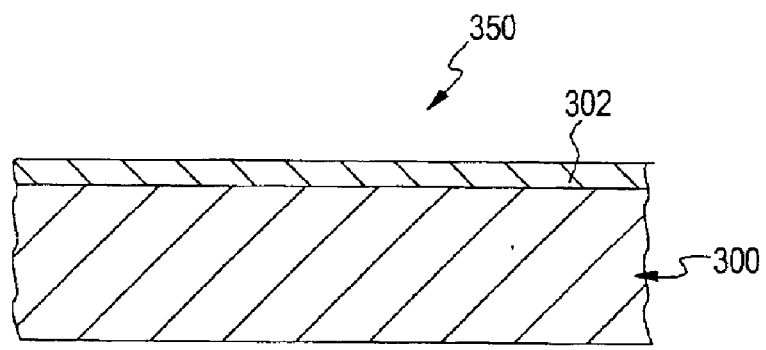
FIGS. 4a–4c illustrate schematic cross-sectional views of a substrate structure at different stages of integrated circuit fabrication incorporating an amorphous carbon layer as an anti-reflective coating.
Figure 4B:
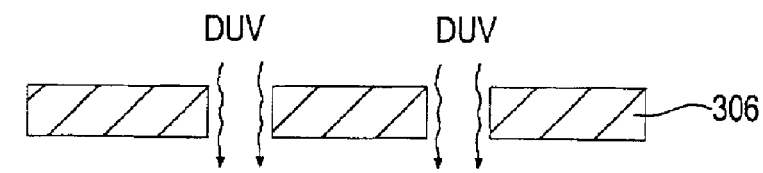
Figure 4C:
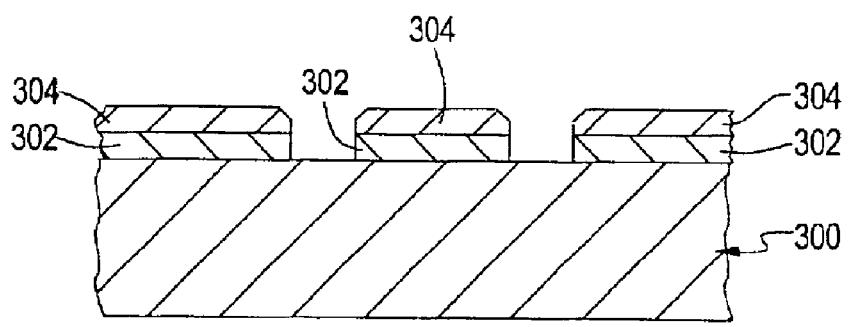

FIGS. 4a–4c illustrate schematic cross-sectional views of a substrate 300 at different stages of an integrated circuit fabrication sequence incorporating an amorphous carbon layer as an anti-reflective coating (ARC). In general, the substrate 300 refers to any workpiece on which film processing is performed, and a substrate structure 350 may be used to generally denote the substrate 300 together with other material layers formed on the substrate 300. Depending on the specific stage of processing, substrate 300 may correspond to a silicon substrate, or other material layer, which has been formed on the substrate. FIG. 4a, for example, illustrates a cross-sectional view of a substrate structure 350 in which the substrate 300 is an oxide layer formed on a silicon wafer.

An amorphous carbon layer 302 may be formed on substrate 300 according to the process parameters described above. The amorphous carbon layer may have a refractive index (n) in the range of about 1.5 to 1.9 and an absorption coefficient (k) in the range of about 0.1 to about 1.0 at wavelengths less than about 250 nm, thus making it suitable for use as an ARC at DUV wavelengths. The refractive index (n) and absorption coefficient (k) for the amorphous carbon ARC are generally tunable, in that they can be varied in the desired range as a function of the temperature as well as the composition of the gas mixture during layer formation. The thickness of the amorphous carbon layer may also be varied depending on the specific stage of processing. Typically, the amorphous carbon layer has a thickness of about 200 Å to about 1100 Å.

FIG. 4b depicts a layer of energy sensitive resist material 304 formed on the substrate structure 350 of FIG. 4a. The layer of energy sensitive resist material can be spin coated on the substrate to a thickness within the range of about 2000 Å to about 6000 Å. The energy sensitive resist material may be selected as a material that is sensitive to DUV radiation having a wavelength less than 250 nm.

An image of a pattern may be introduced into the layer of energy sensitive resist material 304 by exposing such energy sensitive resist material 304 to DUV radiation via mask 306. The image of the pattern introduced into the layer of energy sensitive resist material 304 may be developed in an appropriate developer to define the pattern through such layer. Thereafter, as shown in FIG. 4c, the pattern defined in the energy sensitive resist material 304 may be transferred through the amorphous carbon layer 302. The pattern may be transferred through the amorphous carbon layer 302 using the energy sensitive resist material 304 as a mask. The pattern may be transferred through the amorphous carbon layer 302 by etching it using an appropriate chemical etchant (e. g., ozone, oxygen or ammonia plasmas).

After the amorphous carbon 302 is patterned, such pattern may optionally transferred into the substrate 300. Typically, when substrate 300 includes an oxide layer on a silicon substrate, the etch selectivity of the oxide to a resist mask is about 3:1 to about 5:1. Specifically, the oxide will etch about 3 to 5 times faster than the resist. In contrast, the amorphous carbon ARC layer of the present invention has an etch selectivity to the oxide of greater than about 10:1. That is, the oxide will etch more than 10 times faster than the amorphous carbon ARC. Thus, the amorphous carbon ARC layer also provides greater etch selectivity as a hardmask for patterning the oxide, without the added complexity of requiring an additional intermediate hardmask layer.

In an alternate embodiment, the amorphous carbon layer may include an absorption coefficient (k) that varies across the thickness of the layer. That is, the amorphous carbon layer may have an absorption coefficient gradient formed therein. Such a gradient is formed as a function of the temperature and the composition of the gas mixture during layer formation. Thus, at any interface between two material layers, reflections may occur as a result of the differences in their refractive indices (n) and absorption coefficients (k). When the amorphous carbon ARC has a gradient, it is possible to match the refractive indices (n) and the absorption coefficients (k) of the two material layers so there is minimal reflection and maximum transmission into the amorphous carbon ARC. Then the refractive index (n) and absorption coefficient (k) of the amorphous carbon ARC may be gradually adjusted to absorb all of the light transmitted therein.

C. Multi-Layer Amorphous Carbon Anti-Reflective Coating (ARC)

Figure 5A:
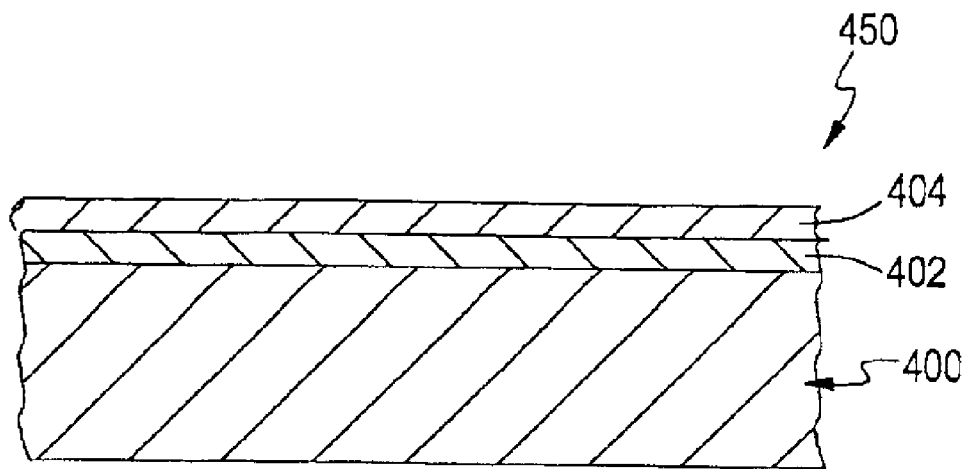
FIGS. 5a–5d illustrate schematic cross-sectional views of a substrate structure at different stages of integrated circuit fabrication incorporating a multilayer amorphous carbon ARC structure.

FIGS. 5a–5d illustrate schematic cross-sectional views of a substrate 400 at different stages of an integrated circuit fabrication sequence incorporating a multi-layer amorphous carbon anti-reflective coating (ARC) structure. In general, the substrate 400 refers to any workpiece on which film processing is performed and a substrate structure 450 is used to generally denote the substrate 400 together with other material layers formed on the substrate 400. Depending on the specific stage of processing, substrate 400 may correspond to a silicon substrate, or other material layer, which has been formed on the substrate. FIG. 5a, for example, illustrates a cross-sectional view of a substrate structure 450 in which the substrate 400 is a silicon wafer.

A first amorphous carbon layer 402 may be formed on the substrate 400 according to the process parameters described above. The first amorphous carbon layer 402 may be designed primarily for light absorption, and as such, the first amorphous carbon layer 402 may have an index of refraction in the range of about 1.5 to about 1.9 and an absorption coefficient (k) in the range of about 0.5 to about 1.0 at wavelengths less than about 250 run. The thickness of the first amorphous carbon layer 402 may be variable depending on the specific stage of processing. Typically, the first amorphous carbon layer 402 has a thickness in the range of about 300 Å to about 1500 Å.

A second amorphous carbon layer 404 may be formed on the first amorphous carbon layer 402. The second amorphous carbon layer 404 may also be formed according to the process parameters described above. The second amorphous carbon layer 404 may be designed primarily for phase shift cancellation. Specifically, the second amorphous carbon layer may be designed to create reflections that cancel those generated at the interface with an overlying material layer (e. g., an energy sensitive resist material). As such, the second amorphous carbon layer 404 may have an index of refraction of about 1.5 to about 1.9 and an absorption coefficient in the range of about 0.1 to about 0.5. The thickness of the second amorphous carbon layer 404 may also be variable depending on the specific stage of processing. Typically, the second amorphous carbon layer 404 has a thickness in the range of about 300 Å to about 700 Å. The refractive index (n) and the absorption coefficient (k) of the first and second amorphous carbon layers are tunable, in that they can be varied as a function of the temperature as well as the composition of the gas mixture during layer formation.

Additional amorphous carbon layers may be included in the multi-layered amorphous carbon ARC structure. For example, more than one top layer can be used to cancel reflections generated at the interface with for example, the energy sensitive resist material, while more than one bottom layer can be used to absorb light transmitted therein minimizing reflections at the interface of the multi-layered amorphous carbon ARC structure with underlying materials such as for example low dielectric constant oxides.

Figure 5B:
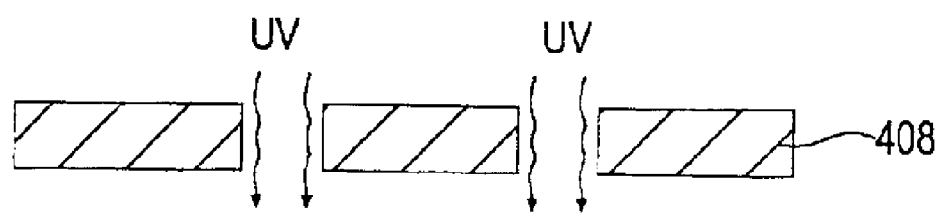
Figure 5B:
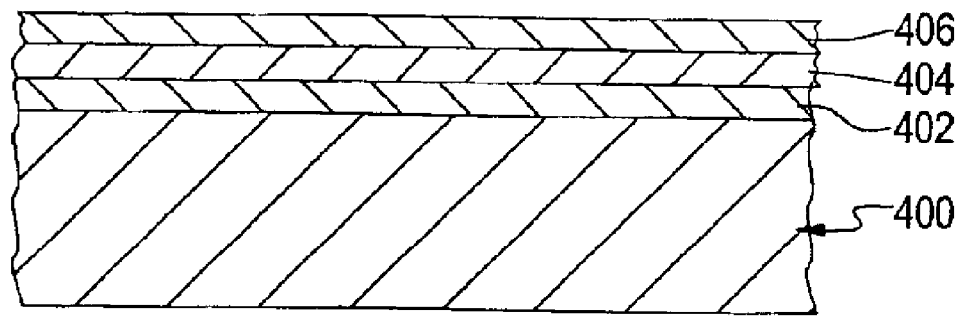
Figure 5C:
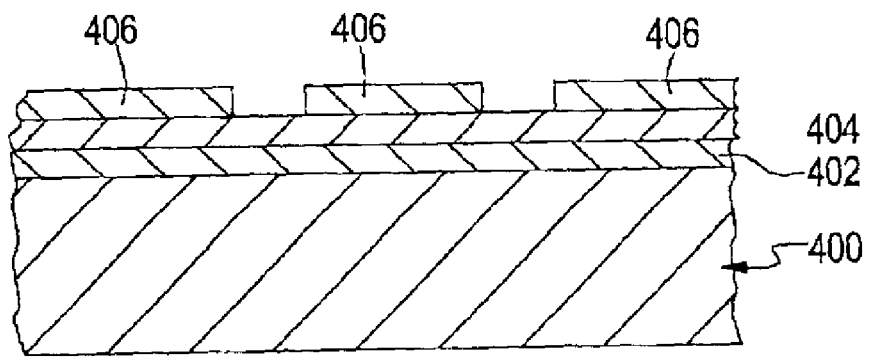
Figure 5D:
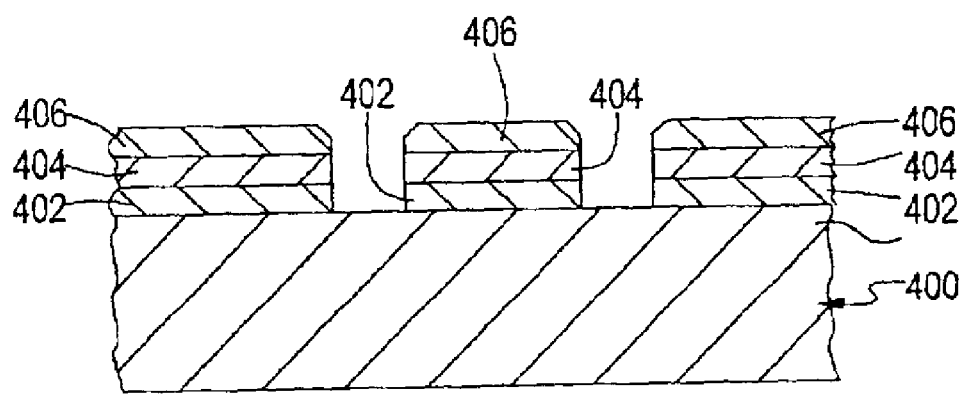

FIG. 5b illustrates a layer of energy sensitive resist material 406 formed on the substrate structure 450 of FIG. 5a. The layer of energy sensitive resist material may be spin coated on the substrate to a thickness within the range of about 2000 Å to about 6000 Å. The energy sensitive resist material is sensitive to DUV radiation having a wavelength less than 260 nm. An image of a pattern may be introduced into the layer of energy sensitive resist material 406 by exposing such energy sensitive resist material 406 to DUV radiation via mask 408. The image of the pattern introduced into the layer of energy sensitive resist material 406 may be developed in an appropriate developer to define the pattern through such layer as shown in FIG. 5c. Thereafter, referring to FIG. 5d, the pattern defined in the energy sensitive resist material 406 may be transferred through both amorphous carbon layers 404, 402 using the energy sensitive resist material 406 as a mask. The pattern may be transferred through the amorphous carbon layers 404, 402 by etching them using an appropriate chemical etchant (e. g., ozone, oxygen or ammonia plasmas). After the multi-layer ARC is patterned, such pattern is optionally transferred into the substrate.

The multi-layered amorphous carbon ARC structure described with reference to FIGS. 5a–5d, may also provide etch selectivity as a hardmask for patterning such underlying material layers as low dielectric constant oxides, without the added complexity of requiring an additional intermediate hardmask layer, as discussed previously for the single-layer amorphous carbon ARC.

D. Silicon Containing Photoresist Layer

In another embodiment of the invention, an improved photoresist may be implemented into a conventional multi-layer resist (MLR) photolithography scheme in order to provide improved transfer characteristics of a pattern into an underlayer, which may be an oxide layer, for example. The improved photoresist generally provides substantially greater selectivity between the photoresist layer and layers formed thereunder as a result of the resist containing silicon, which may operate to form an in situ hardmask in the resist material proximate the surface or outer portion of the resist layer when the resist layer is exposed to oxygen. The hardmask formed in the resist material, which generally provides the improved selectivity, may allow etching processes to be conducted on underlayers without substantially depleting the resist layer. Since the silicon containing resist may form a resist layer hardmask in the resist layer when exposed to oxygen, which is a common etchant, then the intermediate layer or hardmask layer of an MLR process, along with the processes associated therewith, may be eliminated from the photolithography schemes.

Figure 6:
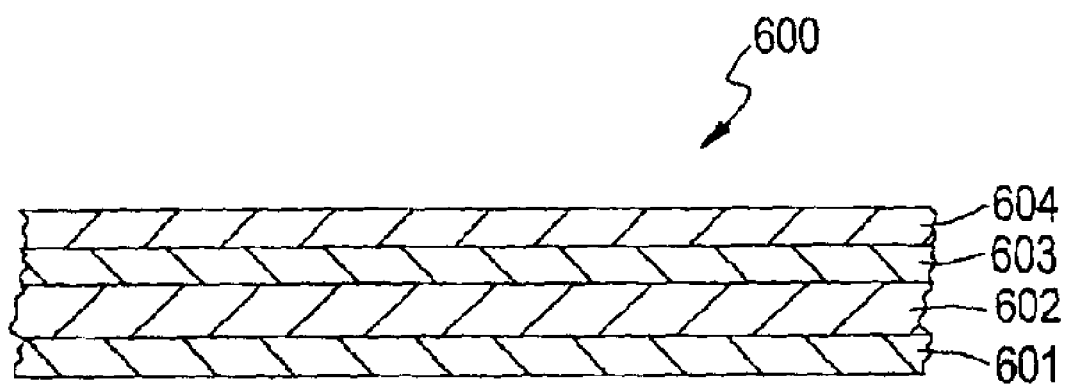
FIG. 6 illustrates a schematic cross-sectional view of an exemplary substrate structure incorporating a silicon containing photoresist.

FIG. 6 illustrates a schematic cross-sectional view of a substrate structure 600 incorporating the silicon containing photoresist of the invention. Substrate structure 600 may be formed using a substrate or wafer 601 as the base structure. A material layer 602, which may be a silicon dioxide layer, silicon nitride layer, or other material layer generally used in manufacturing semiconductor stacks, for example, may be formed on top of the substrate, generally through known CVD techniques. An amorphous carbon layer 603, such as a hardmask layer, may then be formed on top of the material layer 602. However, embodiments of the invention contemplate that the amorphous carbon layer may either be deposited directly on the wafer 601, or alternatively, on top of one or more layers that are deposited on the wafer 601. In similar fashion to the material layer 602, the hardmask amorphous carbon layer 603 may also be formed through known CVD techniques, and therefore, layers 602 and 603 may be deposited in a single CVD chamber in some embodiments of the invention. A photoresist layer 604 may then be formed on top of the amorphous carbon layer 603 through, for example, a spin on deposition process. The photoresist layer 604 of the present exemplary embodiment generally includes a predetermined percentage or concentration of silicon within the photoresist material.

Various techniques may be used to obtain the photoresist having a predetermined quantity of silicon within the resist material. For example, it is common in the photolithography industry for resist manufacturers to add predetermined quantities of selected substances to off the shelf resists at the customer's request, thereby allowing customers to essentially customize a standard resist material to their particular application. Therefore, the present invention contemplates that an efficient method for obtaining a resist having a predetermined quantity of silicon therein would be to order an off the shelf/standard photoresist used in amorphous carbon photolithography processes, wherein the standard photoresist is modified by the manufacturer to include a predetermined amount of silicon therein. Manufacturers offering such photoresists that may have silicon included therein include Shipley, JSR, and TOK, for example. Exemplary photoresists include, but are not limited to, a deep ultraviolet toner photo resist or a 193 photo resist, for example. An alternative technique for obtaining a resist layer having silicon therein would be to utilize a diffusion technique, such as a silylation process, to diffuse silicon into the resist layer after the resist layer is deposited on the respective stack. Silylation processes generally include exposure of a resist material to a gas or vapor that contains a substance that is to be diffused into the resist layer. The quantity and/or percentage of the substance that diffuses into the resist material is generally known to be a function of the physical characteristics of the resist material, the physical characteristics of the vapor or gas containing the substance to be diffused in to the resist material, and the parameters associated with the exposure of the gas or vapor to the resist, such as temperature, pressure, and exposure duration, for example. For example, the deposited photoresist layer may be exposed to a silicon vapor or a silicon containing gas for a predetermined amount of time at a predetermined temperature and pressure in a processing chamber, thus allowing a calculated quantity of the silicon in the vapor/gas to diffuse into the resist layer. The diffusion is generally confined to the outer portion of the resist layer, as diffusion techniques are not generally known to be an efficient method for completely penetrating standard resist layers.

The quantity/percentage of silicon in the resist layer may vary from application to application. For example, embodiments of the invention contemplate that about 3% to about 30% (atomic percent) of the photoresist may be silicon, depending upon the particular application. Preferably, however, the percentage of silicon will be in the range of about 3% to about 10%, and may be, for example, in the range of about 5% to about 7%. However, it is to be understood that the atomic concentration of silicon may be any amount that when exposed to oxygen can form an oxide surface that can function as a hard mask.

Figure 7A:
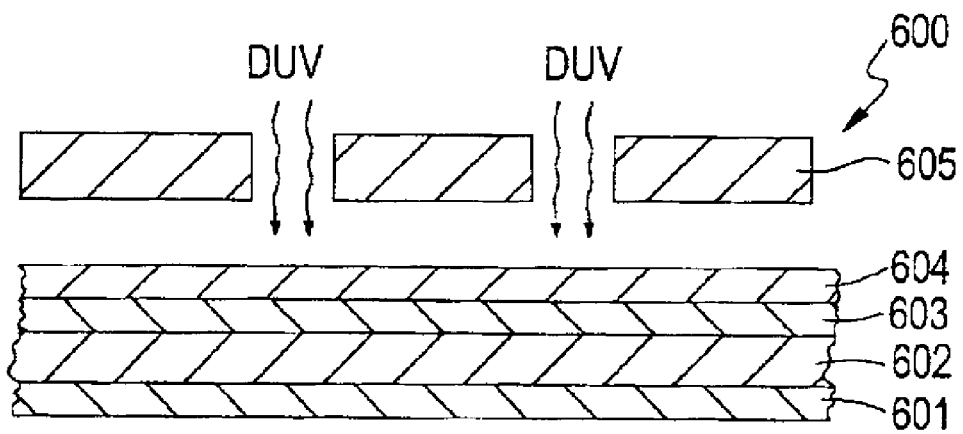
FIGS. 7a and 7b illustrate exemplary cross sectional views of a substrate structure of an embodiment the invention during pattern transfer and resist development stages.
Figure 7B:
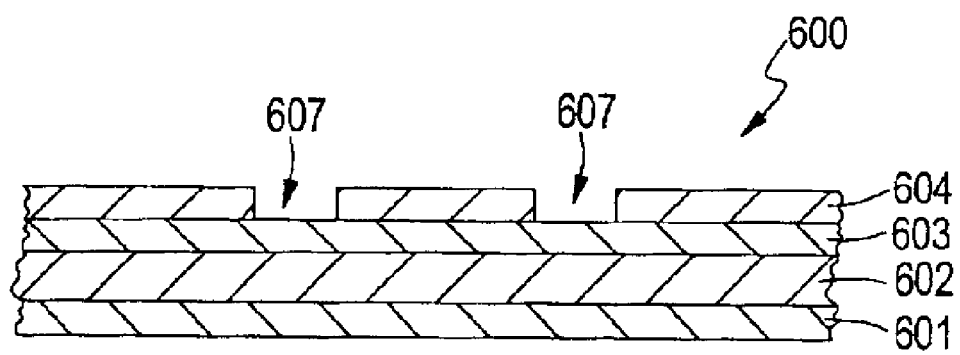

FIG. 7a illustrates an exemplary embodiment of the substrate structure 600 during a pattern transfer process. The pattern transfer process illustrated in generally includes placement of a mask 605 proximate the exposed surface of resist layer 604. The mask 605 may include various apertures 606 formed therein, wherein the apertures 606 are calculated to generate regions/areas in the resist layer 604 to be developed, which is commonly termed a resist pattern. A light source, which is often an ultra violet light emission source, may then be placed above mask 605 in a position that allows a portion of the light emitted from the light source to travel through apertures 606 and contact resist layer 604, while the remaining light may be reflected and/or blocked by the portions of mask 605 that do not include apertures 606. The proximity of mask 605 to resist layer 604, along with the wavelength of the light emitted from the light emission source, allows for the pattern of apertures 606 in mask 605 to be replicated in resist layer 604 through a chemical reaction of the resist layer 604 with the light passing though apertures 606. Thereafter, resist layer 604 may be developed, as shown in FIG. 7b, to remove the portions of the resist layer 604 that were previously exposed to light through mask 605. The removal of portions of resist layer 604, which may be accomplished through known photolithographic development techniques, generates the desired patterns 607 in resist layer 604. The resist pattern generated by the photolithographic processes generally communicates each of the patterns 607 through the entire thickness of resist layer 604, thus exposing the upper surface of the underlying layer 603.

Figure 8A:
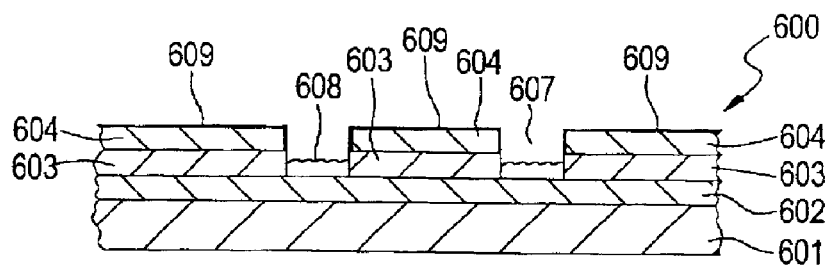
FIGS. 8a and 8b illustrate exemplary cross sectional views of a substrate structure of an embodiment the invention during the formation of an in situ hard mask layer on the exposed surfaces of the resist layer during an etching process.

FIG. 8a illustrates an exemplary schematic cross sectional view of the substrate structure 600 after the patterns/regions 607 have been formed in resist layer 604 and during a subsequent process wherein the patterns are being transferred into the underlying amorphous carbon layer 603. The transfer of patterns/regions 607 into the amorphous carbon layer 603 may be accomplished through an etch process, which may, for example, include an oxygen ($O_2$) based etchant. $O_2$ is known to be an efficient etchant for amorphous carbon layers. Although the exposure of the upper surface 608 of the amorphous carbon layer 603 immediately below the pattern/region 607 in resist layer 604 to an $O_2$ based etchant causes the carbon surface 608 to rapidly etch away, resist layer 604 is also exposed to the $O_2$ based etchant during this process. In conventional resist layers, this type exposure generally operates to erode away the conventional resist layer, which may then allow the $O_2$ based etchant to begin to etch portions of the amorphous carbon layer intended to be masked by the conventional resist layer. MLR techniques have conventionally been used to prevent the $O_2$ based etchants from reaching the amorphous carbon layer, however MLR techniques require additional processing steps, and therefore, are undesirable.

Figure 8B:
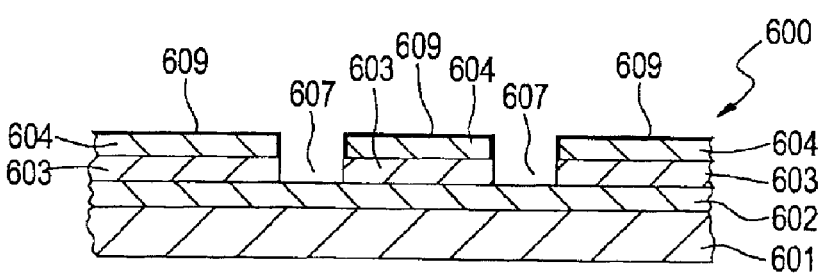

Embodiments of the invention avoid the additional processing steps involved with MLR techniques through the implementation of a predetermined quantity or percentage of silicon into the resist layer 604. Therefore, when the $O_2$ based etchant is used to etch through the amorphous carbon layer 603, the $O_2$ based etchant operates not only to etch the carbon layer 603, but also to form a resist layer hard mask 609 in the outer portion of resist layer 604, as shown in FIGS. 8a and 8b. The resist layer hard mask 609 is generally formed via a chemical reaction between the silicon contained within the resist layer 604 and the $O_2$ based etchant. The hard mask 609 formed via the reaction between the silicon in resist layer 604 and the $O_2$ based etchant generally comprises a silicon oxide ($SiO_2$) layer formed in the outer portion of resist layer 604. The hard mask 609 will generally have a thickness of less than about 1000 Å, and preferably has a thickness of between about 75 Å and 250 Å. A hardmask 609 thickness of about 100 Å to about 200 Å may be preferred in the exemplary embodiment.

The resist layer hard mask 609 offers substantial advantages over conventional MLR processes. One advantage is that the resist layer hard mask 609 operates to substantially reduce erosion of the resist layer 604 during the process of etching the amorphous carbon layer 603. Erosion of the resist layer 604 is substantially reduced as a result of the $SiO_2$ layer 609 providing improved selectivity between the resist layer 604 and the underlying layers to be etched. The improved/greater selectivity provided by the resist layer hard mask 609 may operate to prevent the $O_2$ based etchant from eroding resist layer 604 during the etching process of the amorphous carbon layer 603 without requiring the processes associated with generating and/or forming additional intermediate resist/mask layers, as in conventional MLR processes. Thus, embodiments of the invention implementing the silicon containing resist layer 604 are generally capable of manufacturing semiconductor structures containing an amorphous carbon layer, or other layers having physical properties similar thereto, without requiring the additional process steps or equipment associated with formation/generation of the intermediate resist layers used in conventional MLR processes.

Figure 9A:
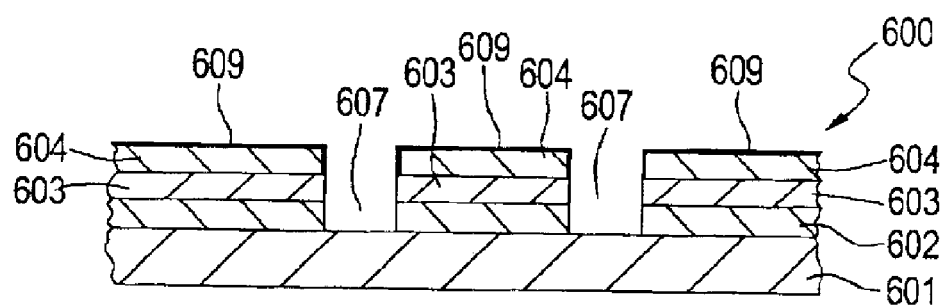
FIG. 9a illustrates the etching process of the material layer.
Figure 9B:
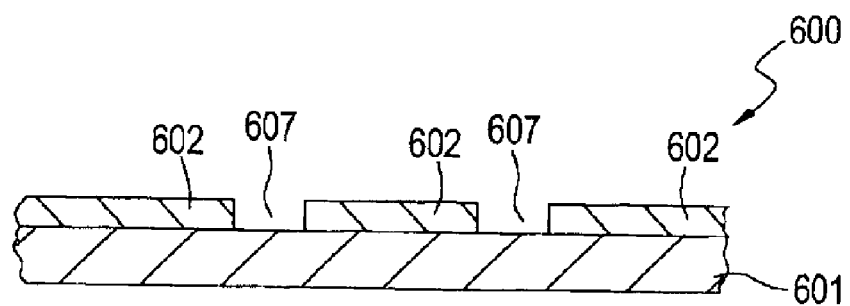
FIG. 9b illustrates the process of removing the overlying layers from the underlying material layer.

Once the amorphous carbon layer 603 has been completely etched away within the desired pattern regions 607, as illustrated in FIG. 8b, then the manufacturing process may continue. The desired patterns in material layer 602, which may be a general oxide layer, polysilicon layer, and/or other layer with similar physical and/or chemical characteristics, may be, for example, formed through another etching process. During this process the silicon oxide layer 609 may again operate to provide additional selectivity/protection for the resist layer 604 from the particular chemical etchant used to remove the desired portions of the material layer 602. Once the desired portions of material layer 602 are removed, as shown in FIG. 9a, then each of the resist layer 604, the resist layer hard mask 609, and the amorphous carbon layer 603 may be removed to reveal the desired patterns 607 in the material layer 602, as shown in FIG. 9b. The removal of the layers 604, 609, and 603 may, for example, also be removed by an etching process, wherein the etchant is calculated to erode away layers 604, 609, and 603 without having a chemical effect upon material layer 602 or the patterns 607 formed therein.

Although several embodiments incorporating the subject matter of the present invention have been shown and described in detail, those skilled in the art may be able to devise additional, alternative, and/or varied embodiments of the invention that may still incorporate the subject matter of the invention. Furthermore, while the foregoing is directed to embodiments of the present invention, other and further embodiments of the invention may be devised without departing from the true scope thereof, wherein the scope thereof is determined by the following claims.

What is claimed is:

1. A method for forming a patterned amorphous carbon layer in a multilayer stack, comprising:
 depositing an amorphous carbon layer on a substrate by a process comprising:
  providing a gas mixture to the deposition chamber, wherein the gas mixture comprises an inert gas and one or more hydrocarbon compounds;
  maintaining the deposition chamber at a pressure between about 1 Torr to about 20 Torr; and
  reacting the gas mixture to form an amorphous carbon layer;

depositing a silicon containing photoresist layer on top of the amorphous carbon layer;

developing a pattern transferred into the resist layer with an ultraviolet radiation photolithographic process; and forming an in situ resist layer hard mask in an outer portion of the photoresist layer while etching through the amorphous carbon layer in at least one region defined by the pattern in the resist layer.

2. The method of claim 1, wherein reacting the gas mixture comprises a plasma enhanced deposition process.

3. The method of claim 1, wherein depositing the silicon containing photoresist layer comprises forming the layer with a spin on deposition process.

4. The method of claim 1, wherein etching through the amorphous carbon layer comprises exposing the amorphous carbon layer to an oxygen based etchant.

5. The method of claim 4, wherein the oxygen based etchant chemically reacts with silicon in the silicon containing photoresist layer to form the resist layer hard mask.

6. The method of claim 5, wherein the resist layer hard mask has a thickness of less than about 1000 Å.

7. The method of claim 5, wherein the resist layer hard mask has a thickness of between about 50 Å and about 1000 Å.

8. The method of claim 5, wherein the resist layer hard mask has a thickness of between about 75 Å and about 250 Å.

9. The method of claim 5, wherein the resist layer hard mask has a thickness of between about 100 Å and about 200 Å.

10. The method of claim 1, further comprising forming a material layer on the substrate with a chemical vapor deposition process prior to forming the amorphous carbon layer.

11. The method of claim 10, wherein the material layer comprises at least one of silicon dioxide and silicon nitride.

12. The method of claim 1, wherein the silicon containing photoresist layer comprises between about 3% to about 30% silicon.

13. The method of claim 1, wherein the silicon containing photoresist layer comprises between about 3% to about 10% silicon.

14. The method of claim 1, wherein the silicon containing photoresist layer comprises between about 5% to about 7% silicon.

15. The method of claim 1, wherein the silicon containing photoresist layer, the amorphous carbon layer, and the resist layer hard mask may be removed by a single etching process selective to these layers and leaving an underlying layer on the substrate.

16. A method for patterning a material layer in a multilayer stack, comprising:

depositing an amorphous carbon layer on the material layer by a process comprising:

providing a gas mixture to the deposition chamber, wherein the gas mixture comprises an inert gas and one or more hydrocarbon compounds;

maintaining the deposition chamber at a pressure between about 1 Torr to about 20 Torr; and reacting the gas mixture to form an amorphous carbon layer;

depositing a photoresist layer on top of the amorphous carbon layer;

developing a resist pattern transferred into the photoresist layer with an ultraviolet radiation photolithographic process;

forming an in situ resist layer hard mask in an outer portion of the photoresist layer while etching through the amorphous carbon layer in a patterned region defined by the resist pattern; and etching through the material layer under the amorphous carbon layer using the patterned region etched into the amorphous carbon layer and the resist pattern.

17. The method of claim 16, wherein forming the photoresist layer further comprises forming the photoresist layer having a predetermined quantity of silicon therein.

18. The method of claim 17, wherein forming the resist layer hard mask further comprises chemically reacting the predetermined quantity of silicon with an oxygen based etchant used to etch the amorphous carbon layer.

19. The method of claim 16, wherein the amorphous carbon layer and the material layer are deposited using a plasma enhanced deposition process.

20. The method of claim 16, wherein depositing the photoresist layer comprises using a spin-on deposition process.

21. The method of claim 16, wherein developing the resist pattern comprises utilizing a deep u;traviolet radiation photolithographic development process.

22. The method of claim 16, wherein etching through the amorphous carbon layer comprises applying an oxygen based etchant to the multilayer stack.

23. The method of claim 16, wherein forming the resist layer hard mask further comprises reacting silicon in the photoresist layer with an oxygen based etchant used to etch the amorphous carbon layer to form a silicon oxide layer in outer portions of the photoresist layer.

24. The method of claim 16, wherein the resist layer hard mask has a thickness of less than about 1000 Å.

25. The method of claim 16, wherein the resist layer hard mask has a thickness of between about 75 Å and about 250 Å.

26. The method of claim 16, wherein the resist layer hard mask has a thickness of between about 100 Å and about 200 Å.

27. The method of claim 16, further comprising removing the resist layer hard mask, the photoresist layer, and the amorphous carbon layer to expose a desired pattern in the material layer.

28. The method of claim 16, wherein forming the resist layer hard mask comprises reacting a first substance in the photoresist layer with a second substance in a chemical etchant to form the resist layer hard mask in an outer portion of the photoresist layer.

29. The method of claim 28, wherein the first substance comprises silicon.

30. The method of claim 28, wherein the second substance comprises oxygen.

31. The method of claim 17, wherein the predetermined quantity of silicon is between about 3% and about 30% silicon.

32. The method of claim 17, wherein the predetermined quantity of silicon is between about 3% and about 10% silicon.

33. The method of claim 17, wherein the predetermined quantity of silicon is between about 5% and about 7% silicon.

34. The method of claim 1, wherein the one or more hydrocarbon compounds have the general formula $C_xH_y$, and x has a range of 2 to 4 and y has a range of 2 to 10.

35. The method of claim 34, wherein the one or more hydrocarbon compounds is selected from the group consisting of propylene ($C_3H_6$), propyne ($C_3H_4$), propane ($C_3H_8$), butane ($C_4H_{10}$), butylene ($C_4H_8$), butadiene ($C_4H_6$), acetelyne ($C_2H_2$), and combinations thereof.

36. The method of claim 1, wherein the one or more hydrocarbon compounds is selected from the group consisting of propylene ($C_3H_6$), acetelyne ($C_2H_2$) and combinations thereof.

37. The method of claim 1, wherein the amorphous carbon layer has a carbon:hydrogen ratio in the range of about 10% hydrogen to about 60% hydrogen.

38. The method of claim 1, wherein the inert gas is selected from the group consisting of helium, argon and combinations thereof.

39. The method of claim 1, wherein the gas mixture further comprises an additive gas selected from the group consisting of ammonia, nitrogen, hydrogen, and combinations thereof.

40. The method of claim 1, wherein the substrate is heated to a temperature between about 100° C. and about 500° C. and the gas mixture is provided to the deposition chamber at a flow rate in a range of about 50 sccm to about 500 sccm.

41. The method of claim 1, wherein the gas mixture is reacted by generating a plasma by a radio frequency (RF) power in a range of about 3 W/in$^2$ to about 20 W/in$^2$.

42. The method of claim 16, wherein the one or more hydrocarbon compounds have the general formula $C_xH_y$, and x has a range of 2 to 4 and y has a range of 2 to 10.

43. The method of claim 42, wherein the one or more hydrocarbon compounds is selected from the group consisting of propylene ($C_3H_6$), propyne ($C_3H_4$), propane ($C_3H_8$), butane ($C_4H_{10}$), butylene ($C_4H_8$), butadiene ($C_4H_6$), acetelyne ($C_2H_2$), and combinations thereof.

44. The method of claim 16, wherein the one or more hydrocarbon compounds is selected from the group consisting of propylene ($C_3H_6$), acetelyne ($C_2H_2$) and combinations thereof.

45. The method of claim 16, wherein the amorphous carbon layer has a carbon:hydrogen ratio in the range of about 10% hydrogen to about 60% hydrogen.

46. The method of claim 16, wherein the inert gas is selected from the group consisting of helium, argon and combinations thereof.

47. The method of claim 16, wherein the gas mixture further comprises an additive gas selected from the group consisting of ammonia, nitrogen, hydrogen, and combinations thereof.

48. The method of claim 16, wherein the substrate is heated to a temperature between about 100° C. and about 500° C. and the gas mixture is provided to the deposition chamber at a flow rate in a range of about 50 sccm to about 500 sccm.

49. The method of claim 16, wherein the gas mixture is reacted by generating a plasma by a radio frequency (RF) power in a range of about 3 W/in$^2$ to about 20 W/in$^2$.

* * * * *

UNITED STATES PATENT AND TRADEMARK OFFICE
CERTIFICATE OF CORRECTION

PATENT NO. : 6,967,072 B2  Page 1 of 1
APPLICATION NO. : 09/921938
DATED : November 22, 2005
INVENTOR(S) : Ian Latchford et al.

It is certified that error appears in the above-identified patent and that said Letters Patent is hereby corrected as shown below:

Column 2, Line 42: Before "exhibits", delete "is"

Column 5, Line 55: Change "incoloy" to --Incoloy--

Column 6, Line 29: Change "(CxHy)" to --$(C_xH_y)$--

Column 7, Line 3: Insert a space after "$N_2$"

Column 8, Line 51: Change "shorn" to --shown--

Column 9, Line 58: After "optionally", insert --be--

Column 10, Line 41: Change "run" to --nm--

Column 11, Line 14: Change "260" to --250--

Column 13, Line 65: Change "$(Si0_2)$" to --$(SiO_2)$--

Column 16, Line 20: Change "u;traviolet" to --ultraviolet--

Signed and Sealed this

Tenth Day of October, 2006

JON W. DUDAS
*Director of the United States Patent and Trademark Office*